United States Patent
Shirai

(10) Patent No.: US 10,923,190 B2
(45) Date of Patent: Feb. 16, 2021

(54) MEMORY DEVICE

(71) Applicant: TOSHIBA MEMORY CORPORATION, Tokyo (JP)

(72) Inventor: Yutaka Shirai, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/566,694

(22) Filed: Sep. 10, 2019

(65) Prior Publication Data

US 2020/0303007 A1    Sep. 24, 2020

(30) Foreign Application Priority Data

Mar. 22, 2019  (JP) ................. 2019-054486

(51) Int. Cl.
*G11C 13/00* (2006.01)
*H01L 45/00* (2006.01)
*H01L 27/24* (2006.01)

(52) U.S. Cl.
CPC ........ *G11C 13/0069* (2013.01); *G11C 13/003* (2013.01); *G11C 13/0004* (2013.01); *G11C 13/0026* (2013.01); *G11C 13/0028* (2013.01); *G11C 13/0038* (2013.01); *G11C 13/0061* (2013.01); *H01L 45/06* (2013.01); *G11C 2013/0078* (2013.01); *G11C 2013/0092* (2013.01); *G11C 2213/72* (2013.01); *H01L 27/2481* (2013.01); *H01L 45/144* (2013.01)

(58) Field of Classification Search
USPC ....................................................... 365/163
See application file for complete search history.

(56) References Cited

U.S. PATENT DOCUMENTS

| | | | | |
|---|---|---|---|---|
| 6,163,475 | A * | 12/2000 | Proebsting ............. | G11C 7/065 |
| | | | | 257/E21.659 |
| 7,535,756 | B2 * | 5/2009 | Lung ................... | G11C 11/5678 |
| | | | | 365/148 |
| 8,498,142 | B2 * | 7/2013 | Murooka ........... | G11C 13/0007 |
| | | | | 365/148 |
| 9,202,538 | B2 | 12/2015 | Gupta et al. | |
| 2013/0279255 | A1 * | 10/2013 | Kamata ................. | G11C 16/26 |
| | | | | 365/185.11 |
| 2018/0158525 | A1 * | 6/2018 | Nozaki .............. | G11C 13/0038 |

FOREIGN PATENT DOCUMENTS

| WO | WO-2008/035392 A1 | 3/2008 |
| WO | WO-2010-041325 A1 | 4/2010 |

* cited by examiner

*Primary Examiner* — Muna A Techane
(74) *Attorney, Agent, or Firm* — Foley & Lardner LLP

(57) ABSTRACT

According to one embodiment, a device includes: a memory cell between the first and second interconnects; a first circuit in a domain having a range of a first voltage to a second voltage higher than the first voltage, the first circuit controlling supply of the second voltage to the first interconnect; a second circuit in a domain having a range of a third voltage lower than the first voltage to the first voltage, the second circuit controlling supply of the third voltage to the second interconnect; and a third circuit in a domain having a range of a fourth voltage lower than the first voltage to a fifth voltage higher than the first voltage, the third circuit controlling supply of a sixth voltage to the first and second interconnects.

19 Claims, 8 Drawing Sheets

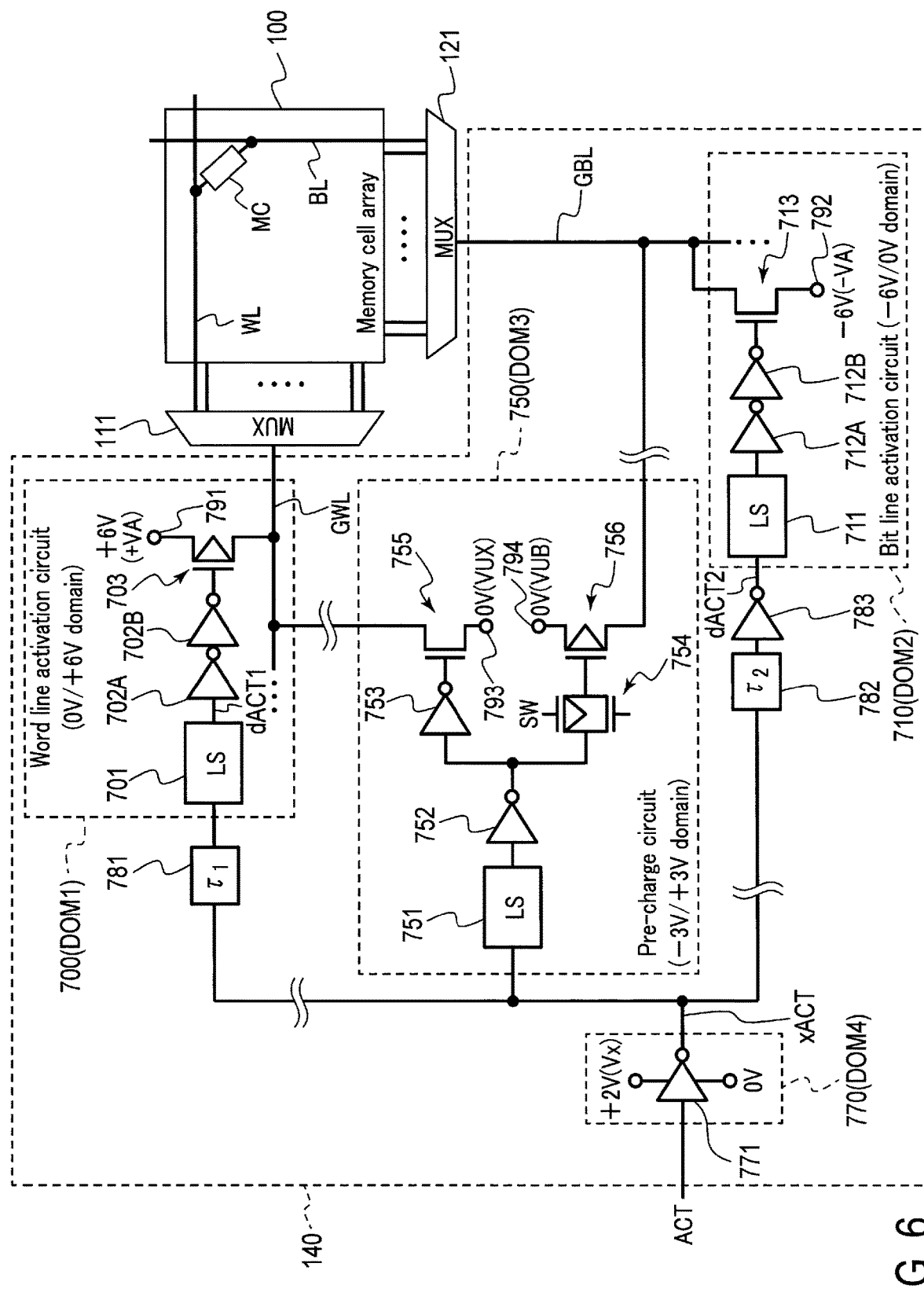
F I G. 6

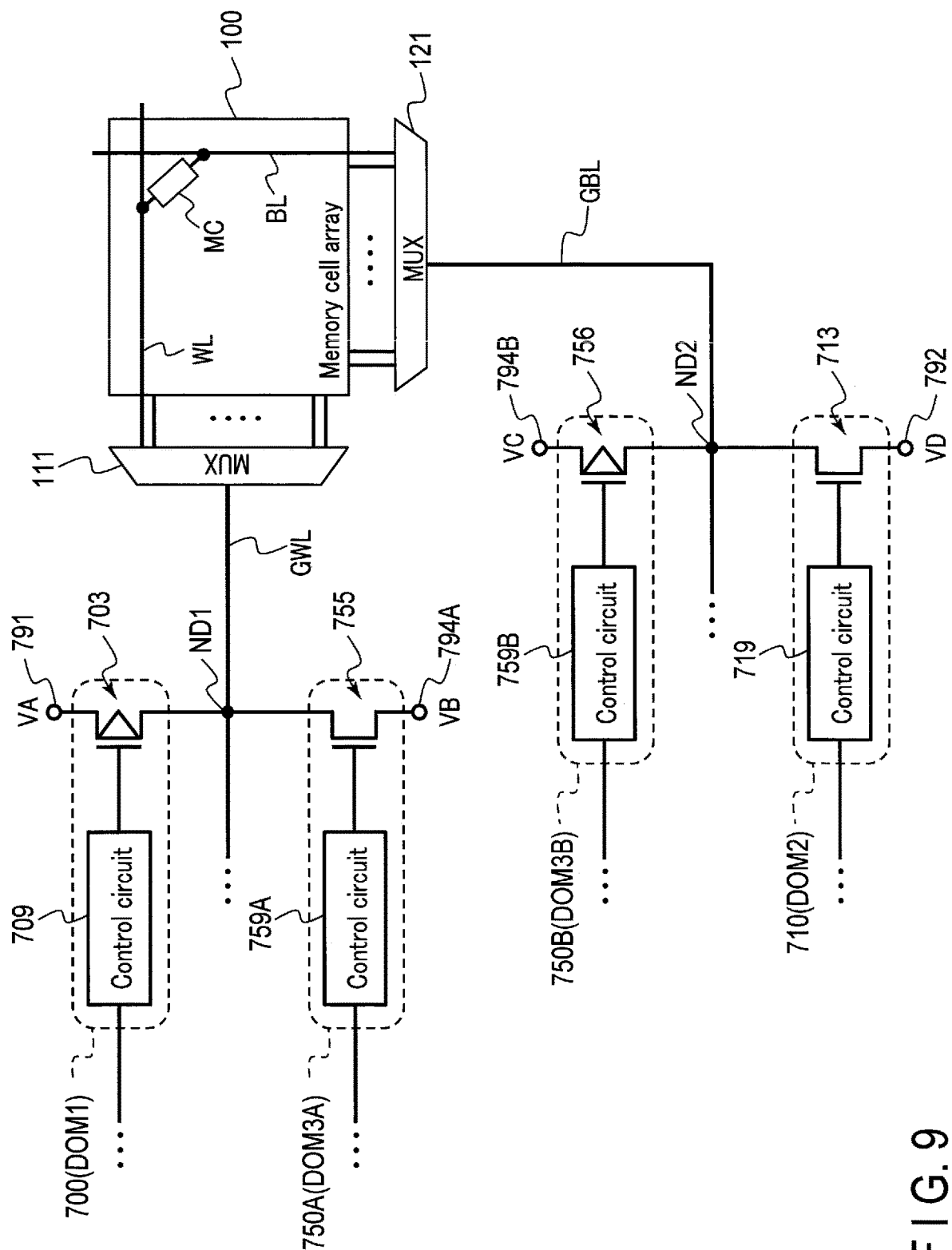
F I G. 9

MEMORY DEVICE

CROSS-REFERENCE TO RELATED APPLICATIONS

This application is based upon and claims the benefit of priority from Japanese Patent Application No. 2019-054486, filed Mar. 22, 2019, the entire contents of which are incorporated herein by reference.

FIELD

Embodiments described herein relate generally to a memory device.

BACKGROUND

Studies and developments of novel memory devices, such as a magnetic memory, a resistance change memory, and a phase change memory, have been promoted.

BRIEF DESCRIPTION OF THE DRAWINGS

FIGS. 1, 2, 3, 4, 5, and 6 are diagrams showing configuration examples of a memory device according to a first embodiment.

FIG. 9 is a diagram showing a configuration example of a memory device according to a third embodiment.

DETAILED DESCRIPTION

Figure 1:
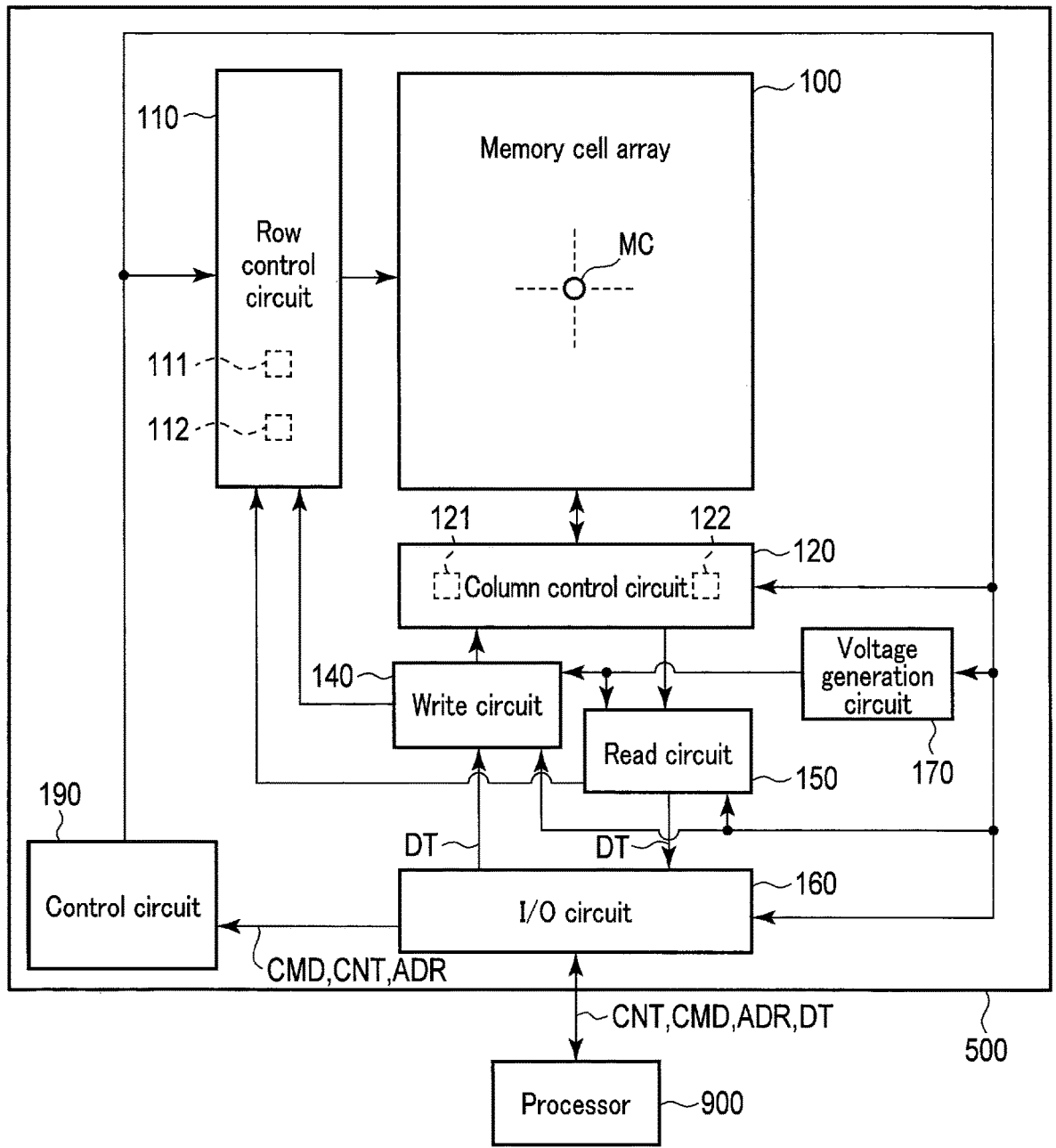

Memory devices according to the embodiments will be described with reference to FIGS. 1 to 9.

Hereinafter, the embodiments will be explained referring to the drawings. In the following explanation, components having the same functions and structures will be referred to by the same reference symbols.

In each of the following embodiments, if components (e.g., word lines WL, bit lines BL, and various voltages and signals) provided with reference symbols accompanied by numbers/alphabetical letters at their tail ends for differentiation purposes need not necessarily be mutually distinguished, descriptions (reference symbols) with numbers/alphabetical letters have been omitted are used.

In general, according to one embodiment, a memory device includes: a first interconnect; a second interconnect; a memory cell electrically coupled between the first interconnect and the second interconnect and including a memory element; a first circuit provided in a first power source domain having a range of a first voltage to a second voltage, the second voltage higher than the first voltage, the first circuit controlling a start and a stop of supply of the second voltage to the first interconnect; a second circuit provided in a second power source domain having a range of a third voltage to the first voltage, the third voltage lower than the first voltage, the second circuit controlling a start and a stop of supply of the third voltage to the second interconnect; and a third circuit provided in a third power source domain having a range of a fourth voltage to a fifth voltage, the fourth voltage lower than the first voltage, the fifth voltage higher than the first voltage, the third circuit controlling a start and a stop of supply of a sixth voltage to the first and second interconnects.

(1) First Embodiment

A memory device according to a first embodiment will be described with reference to FIGS. 1 to 7.

(A) CONFIGURATION EXAMPLE

A configuration example of a memory device of the embodiment will be described with reference to FIGS. 1 to 5.

FIG. 1 is a block diagram showing a configuration example of a memory device according to the embodiment.

As shown in FIG. 1, a memory device 500 according to the embodiment includes a memory cell array 100, a row control circuit 110, a column control circuit 120, a write circuit 140, a read circuit 150, an I/O circuit 160, a voltage generation circuit 170, a control circuit 190, etc.

The memory cell array 100 includes a plurality of memory cells MC and a plurality of interconnects. A memory cell MC is coupled to a corresponding interconnect. Each memory cell MC includes a variable resistance element 1.

The row control circuit 110 controls a plurality of rows of the memory cell array 100. An address decoding result (row address) is supplied to the row control circuit 110. The row control circuit 110 sets a row (e.g., word line) based on the address decoding result to a selected state. In the following, the row (or word line) set to the selected state is referred to as a "selected row (or selected word line)". The rows other than the selected row are referred to as "unselected rows (unselected word lines)".

For example, the row control circuit 110 includes a multiplexer (word line select circuit) 111, a word line driver 112, etc.

The column control circuit 120 controls a plurality of columns of the memory cell array 100. An address decoding result (column address) from the control circuit 190 is supplied to the column control circuit 120. The column control circuit 120 sets a column (e.g., at least one bit line) based on the address decoding result to a selected state. In the following, a column (or bit line) set to the selected state is referred to as a "selected column (or selected bit line)". The columns other than the selected column are referred to as "unselected columns (or unselected bit lines")".

The column control circuit 120 includes a multiplexer (bit line select circuit) 121, a bit line driver 122, etc.

The write circuit (also referred to as a "write control circuit" or "write driver") 140 performs various kinds of control for write operations (writing of data). The write circuit 140 supplies, during a write operation, a write pulse formed by a current and/or a voltage to a memory cell MC, via the row control circuit 110 and the column control circuit 120. With this configuration, data DT is written in the memory cell MC.

For example, the write circuit 140 includes a voltage source and/or a current source, a latch circuit, etc.

The read circuit (also referred to as a "read control circuit" or "read driver") 150 performs various kinds of control for read operations (reading of data). The read circuit 150 supplies, during a read operation, a read pulse (e.g., read current) to a memory cell MC via the row control circuit 110 and the column control circuit 120. The read circuit 150 senses a potential or a current value of a bit line BL. Based on this sensing result, data in the memory cell MC is read.

For example, the read circuit 150 includes a voltage source and/or a current source, a latch circuit, a sense amplifier circuit, etc.

The write circuit 140 and the read circuit 150 are not limited to such mutually independent circuits. For example, the write circuit and the read circuit may include mutually usable common components and may be provided as a single integral circuit in the memory device 500.

The I/O circuit (input/output circuit) 160 is an interface circuit for transmitting and receiving various signals in the memory device 500.

The I/O circuit 160 transfers, as write data, data DT received from a processor 900 of an external device (controller or host device) to the write circuit 140, during a write operation. During a read operation, the I/O circuit 160 transfers, to the processor 900, as read data, data DT output from the memory cell array 100 to the read circuit 150.

The I/O circuit 160 transfers an address ADR and a command CMD received from the processor 900 to the control circuit 190. The I/O circuit 160 transmits and receives various control signals CNT between the control circuit 190 and the external device.

The voltage generation circuit 170 generates a voltage for various operations of the memory cell array 100 using a power source voltage provided from the external device. For example, the voltage generation circuit 170 outputs various voltages generated for write operations to the write circuit 140, during write operations. The voltage generation circuit 170 outputs various voltages generated for read operations to the read circuit 150, during read operations.

The control circuit 190 (referred to as a "state machine," "sequencer," or "internal controller") controls operations of various circuits in the memory device 500, based on a control signal CNT, an address ADR, and a command CMD.

The command CMD is a signal indicating an operation that should be executed by the memory device 500, for example. The address ADR is a signal indicating coordinates of one or more memory cells (referred to as "selected cells" below) intended for an operation in the memory cell array 100, for example. Each address ADR includes a row address and a column address of a selected cell. For example, a control signal CNT is a signal for controlling the operation timing between the external device and the memory device 500, and the operation timing in the inside of the memory device 500.

The control circuit 190 includes a command decoder, an address decoder, a latch circuit, etc., for example.

<Memory Cell Array>

Figure 2:
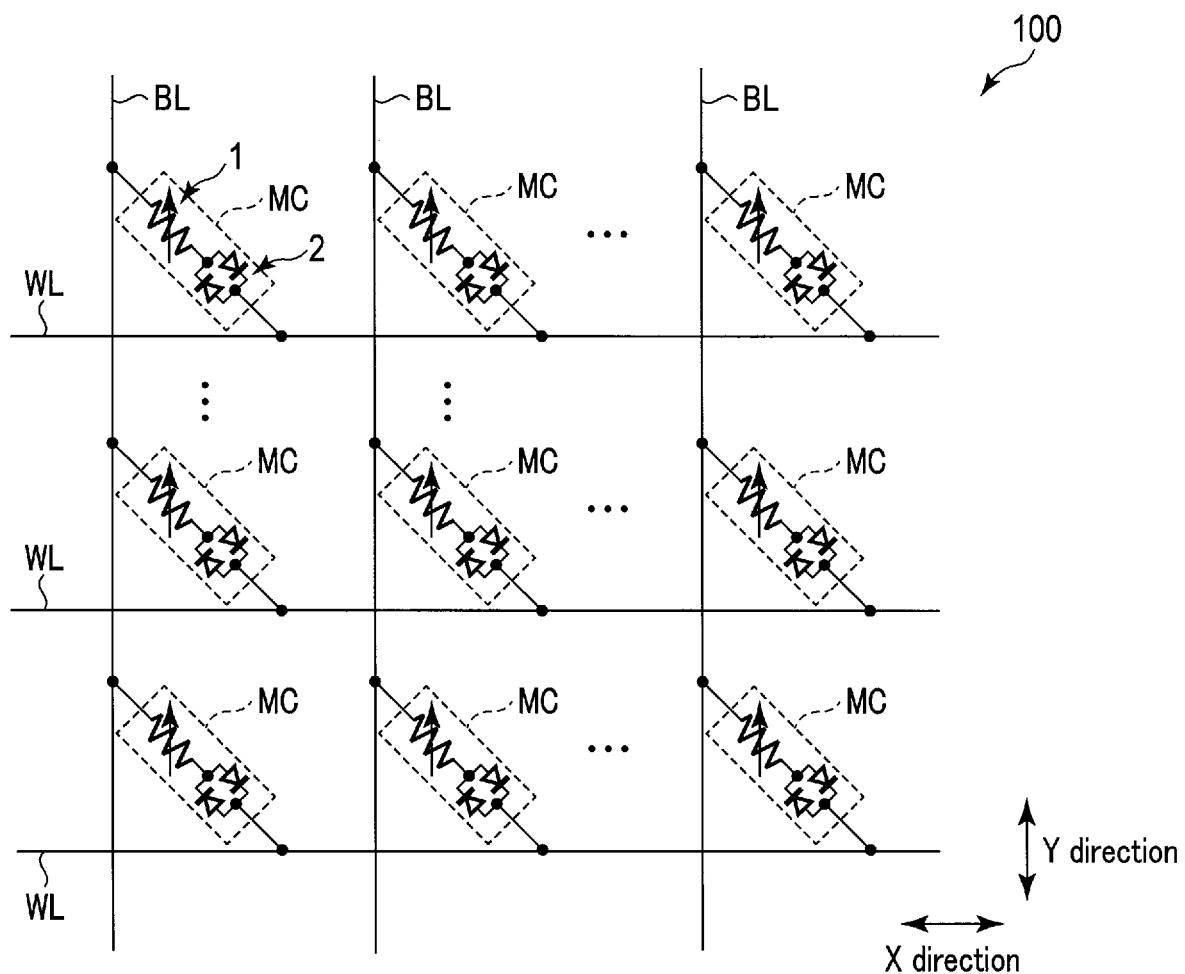

FIG. 2 is an equivalent circuit diagram showing an example of the configuration of a memory cell array of the memory device.

As shown in FIG. 2, in the memory device 500, a plurality of word lines WL are arranged in a Y-axis direction in the memory cell array 100, with each word line WL extending in an X-axis direction. A plurality of bit lines BL are arranged in the X-axis direction in the memory cell array 100, with each bit line BL extending in the Y-axis direction.

Each memory cell MC is arranged at a position where a bit line BL crosses a word line WL. One end of a memory cell MC is coupled to a bit line BL, and the other end of the memory cell MC is coupled to a word line WL.

The plurality of memory cells MC arranged in the X-axis direction are coupled in common to a single word line WL. The plurality of memory cells MC arranged in the Y-axis direction are coupled to a single bit line BL.

For example, if the memory device according to the embodiment is a phase change memory, one memory cell MC includes one phase change memory element (variable resistance element) 1 and one switching element 2.

In the phase change memory, the phase change memory element 1 functions as a memory element. In the phase change memory element 1, the state (phase) of a layer in the phase change memory element 1 reversibly changes to a crystallized state or an amorphous state in accordance with a write pulse supplied. In the phase change memory element 1, the conductive property (resistance value or impedance) of the layer varies in accordance with the crystallized state or amorphous state of the layer. The phase change memory element 1 is used as a memory element storing data of 1 bit or more, depending on an association between data and each of a plurality of phases (states) that can be taken by the layer.

The switching element 2 switches between the ON/OFF (Selected/Unselected) states of a memory cell MC.

The switching element 2 is set to an ON state (a low-resistance state or a conductive state) when a voltage equal to or higher than a threshold voltage of the switching element 2 is applied to a memory cell MC. The switching element 2 is set to an OFF state (a high resistance state or a non-conductive state) when a voltage less than the threshold voltage of the switching element 2 is applied to a memory cell.

The switching element 2 being in the ON state allows a current to flow into a memory cell MC. The switching element 2 being in the ON state supplies, to the phase change memory element 1, a current flowing from the bit line side toward the word line side, or a current flowing from the word line side toward the bit line side, in accordance with a potential difference between the bit line and the word line. The switching element 2 is an element capable of causing bidirectional current flow into the phase change memory element 1. The switching element 2 functions as a bidirectional diode, for example.

Figure 3:
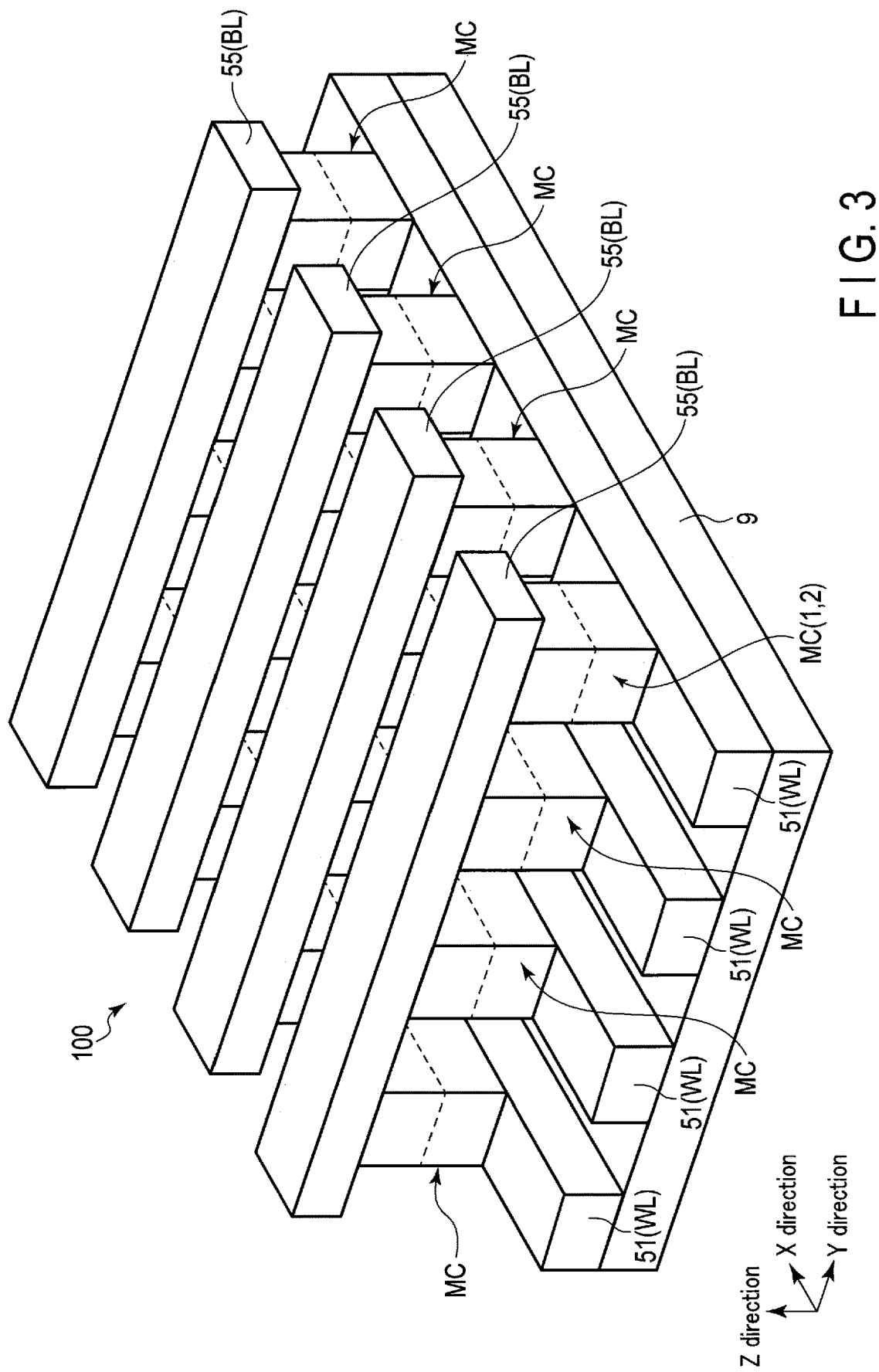

FIG. 3 is a bird's eye view showing a configuration example of a memory cell array in the phase change memory of the embodiment.

As shown in FIG. 3, the memory cell array 100 includes a plurality of interconnects 51, a plurality of memory cells MC, and a plurality of interconnects 55.

Each interconnect 51 extends in the X-axis direction. The plurality of interconnects 51 are arranged in the Y-axis direction.

Each interconnect 55 extends in the Y-axis direction. The plurality of interconnects 55 are arranged in the X-axis direction. Each of the interconnects 55 is provided above each of the interconnects 51 in a Z-axis direction.

The X-axis direction is a direction parallel to the surface of an interlayer film (substrate) 9. The Y-axis direction is a direction parallel to the surface of the interlayer film 9 and intersecting (for example, orthogonal to) the X-axis direction. The Z-axis direction is a direction perpendicular to the surface (X-Y plane) of the interlayer film 9.

One of interconnect 51 and interconnect 55 is a word line, and the other is a bit line. In the example shown in FIG. 3, the interconnect 51 is a word line WL, and the interconnect 55 is a bit line BL.

The plurality of memory cells MC are two-dimensionally arranged in an X-Y plane of the memory cell array 100.

Each memory cell MC is provided between the interconnect 51 and the interconnect 55. Each of the memory cells MC is stacked on each of the interconnects 51. Each of the interconnects 55 is stacked on each of the memory cells MC.

The memory cell MC has a quadrangular prism-shaped structure, for example. The phase change memory element 1 and the switching element 2 respectively have a quadrangular cross-sectional shape. The memory cells MC may have a columnar structure. In a columnar memory cell MC, the phase change memory element 1 and the switching element 2 respectively have a quadrangular cross-sectional shape.

The structure of the memory cell array 100 is not limited to the example shown in FIG. 3.

In the memory cell array 100, the plurality of memory cells MC may be arranged in the Z-axis direction, for example. In this case, neighboring memory cells MC in the Z-axis direction are coupled in common to the interconnect 55 (or the interconnect 51). For example, in neighboring memory cells MC in the Z-axis direction, the arrangement (arrangement order) of the phase change memory elements 1 and the switching elements 2 in the Z-axis direction is preferably set so as to have a mirror image relationship with a focus on a shared interconnect 55.

Figure 4:
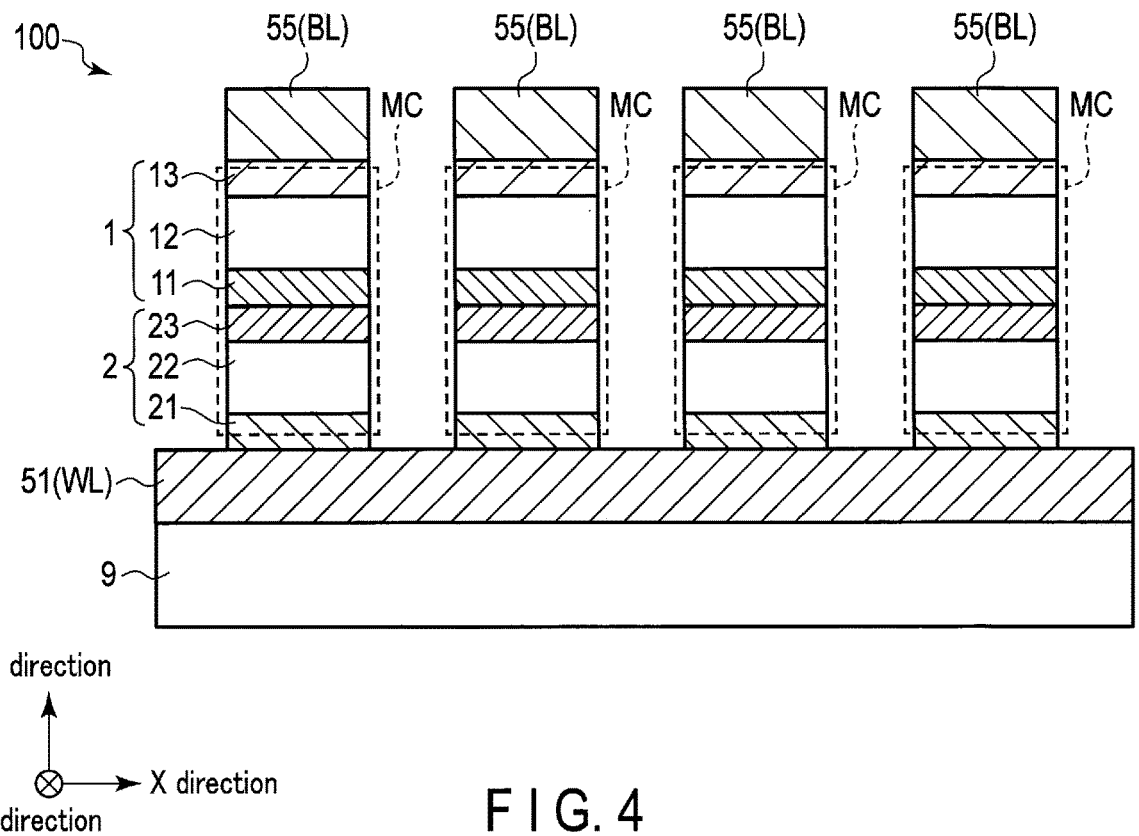

FIG. 4 shows a cross-sectional structure of a memory cell array in a phase change memory according to the embodiment. FIG. 4 shows a cross-section (X-Z plane) of a memory cell array along the X-axis direction.

As shown in FIG. 4, the memory cell MC is a stack including a phase change memory element 1 and a switching element 2. The phase change memory element 1 is provided on the switching element 2 in the Z-axis direction.

The switching element 2 is a variable resistance element having two terminals. The switching element 2 includes two electrodes (terminals) 21, 23, and a switching layer (resistance change layer) 22. In the switching element 2, the electrode 21, the switching layer 22, and the electrode 23 are arranged along the Z-axis direction. The electrode 21 is provided on a top surface of the interconnect (herein, word line) 51. The switching layer 22 is provided on a top surface of the electrode 21. The electrode 23 is provided on a top surface of the switching layer 22. In this way, the switching layer 22 is provided between the two electrodes 21 and 23 in the Z-axis direction. A material of the switching layer 22 is a transition metal oxide or a chalcogenide compound, for example.

The phase change memory element 1 has two terminals. The phase change memory element 1 includes two electrodes (terminals) 11, 13, and a phase change layer (compound layer) 12, for example. In the phase change memory element 1, the electrode 11, the phase change layer 12, and the electrode 13 are arranged along the Z-axis direction. The electrode 11 is provided on a top surface of the electrode 23. The phase change layer 12 is provided on a top surface of the electrode 11. The electrode 13 is provided on a top surface of the phase change layer 12. The interconnect (herein, bit line) 55 is provided on a top surface of an electrode 13. In this way, the phase change layer 12 is provided between the two electrodes 11 and 13 in the Z-axis direction. A material of the phase change layer 12 is a chalcogenide compound (e.g., GeSbTe), for example.

In the memory cell, the same material as that of the electrode (conductive layer) 11 in the phase change memory element 1 may be used for the electrode 23 in the switching element 2. In this case, in the switching element 2 and the phase change memory element 1, one electrode between these elements 1 and 2 may be used in common.

The state of the phase change layer 12 in the phase change memory element 1 varies by application of heat (e.g., Joule heat) to the phase change layer 12. When the state (phase) of the phase change layer 12 is in an amorphous state, the phase change memory element 1 moves to a high-resistance state. When the state of the phase change layer 12 is in a crystallized state, the phase change memory element 1 becomes to a low-resistance state.

For example, the state where the phase change layer 12 in the phase change memory element 1 is in a crystallized state is referred to as a "set state". The state where the phase change layer 12 in the phase change memory element 1 is in an amorphous state is referred to as a "reset state".

A write operation to change the state of the phase change memory element 1 from the reset state to the set state is referred to as a "set operation". A write operation to change the state of the phase change memory element 1 from the set state to the reset state is referred to as a "reset operation".

For example, a pulse form of a write voltage used in a reset operation (referred to as a "reset voltage" below) differs from a pulse form of a write voltage used in a set operation (referred to as a "set voltage" below). The voltage value of the reset voltage is higher than that of the set voltage. The pulse width of the set voltage is greater than that of the reset voltage.

In this way, the state of the phase change layer 12 changes into an amorphous state (reset state) via the quenching of the phase change layer 12, through the generation of comparatively high temperature heat of the phase change layer 12 by application of a reset voltage. The state of the phase change layer 12 changes to a crystallized state by the slow cooling of the phase change layer 12, through the generation of comparatively low temperature heat of the phase change layer 12 by application of a set voltage.

<Write Circuit>

Figure 5:
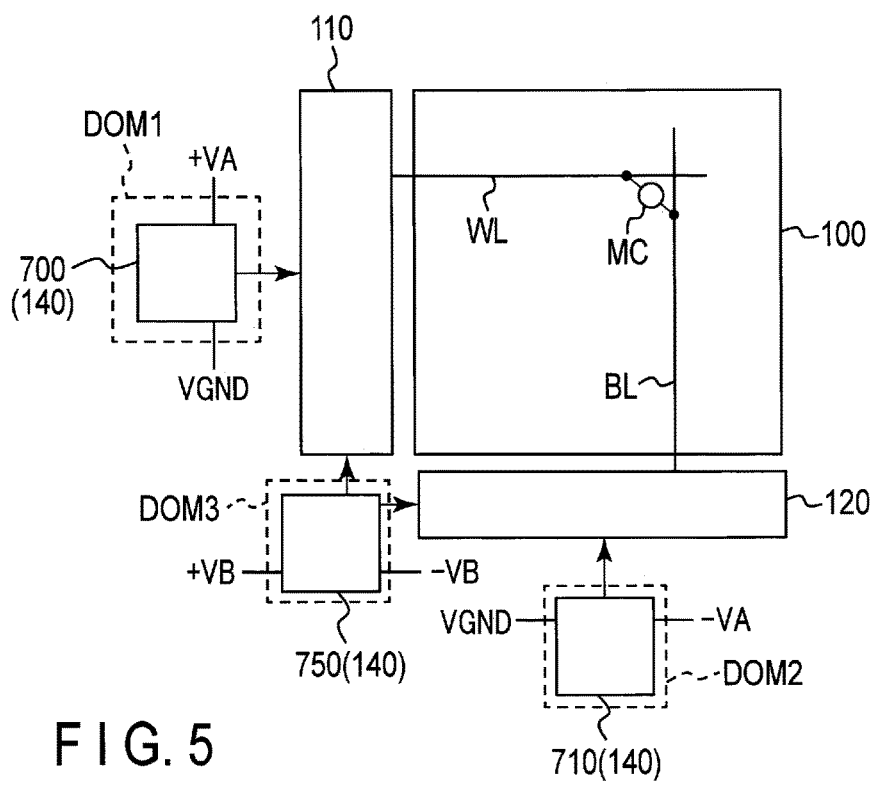

FIG. 5 is a schematic diagram of a configuration example of a write circuit in the phase change memory according to the embodiment.

As shown in FIG. 5, in the phase change memory 500 of the embodiment, the write circuit 140 includes three or more power source domains (also referred to as "voltage areas") DOM1, DOM2, and DOM3. The power source domains are each independently controllable circuit areas (or one or more elements/circuit) having a range of voltage values.

In a first power source domain DOM1, a voltage in the range of a reference voltage (e.g., ground voltage) "VGND" to a positive voltage "VA" is supplied to one or more circuits/elements in the first domain DOM1.

For example, a circuit belonging to the first power source domain DOM1 (also referred to as a "positive voltage circuit" or "positive voltage output circuit" below) 700 can output either a positive voltage or a ground voltage.

The voltage of the first power source domain DOM1 is used for supplying a voltage to one (e.g., word line) of the word line WL and the bit line BL.

A second power source domain DOM2 is independent of the first power source domain DOM1.

In the second power source domain DOM2, a voltage in the range of a negative voltage "−VA" to the reference voltage "VGND" is supplied to one or more circuits/elements in the second domain DOM2.

For example, a circuit belonging to the second power source domain DOM2 (also referred to as a "negative voltage circuit" or "negative voltage output circuit" below) 710 can output either a negative voltage or a ground voltage.

The voltage of the second power source domain DOM2 is used for supplying a voltage to the other (e.g., bit line) of the word line WL and the bit line BL.

For example, the absolute value of a difference in potential between a maximum voltage "VGND" and a minimum voltage "−VA", used in the second power source domain DOM2, is equal to the absolute value of a difference in potential between a maximum voltage "+VA" and a minimum voltage "VGND", used in the first power source domain DOM1. In a third power source domain DOM3, a voltage in an intermediate range between the range of the first voltage domain DOM1 and the range of the second voltage domain DOM2 is supplied to one or more circuits/elements in the voltage domain DOM3.

For example, in the third power source domain DOM3, a voltage in the range of a negative voltage "−VB" to a positive voltage "+VB" is supplied to one or more circuits/elements in the domain. The absolute value of a voltage value of VB is smaller than the absolute value of a voltage value of VA. The absolute value of the voltage VB is appropriately equal to the absolute value of VA/2, for example.

For example, the absolute value of a difference in potential between a maximum voltage (voltage value) "+VB" and a minimum voltage "−VB", used in the third power source domain DOM3, is equal to the absolute value of a difference in potential between the maximum voltage "+VA" and the minimum voltage "VGND", used in the first power source domain DOM1.

For example, a circuit 750 belonging to the third power source domain DOM3 can output a negative voltage, a positive voltage, or a ground voltage.

The voltage of the third power source domain DOM3 is used in common for supplying a voltage to the word line WL and the bit line BL.

For example, a circuit 700 concerned with control of word lines WL is provided in the first voltage domain DOM1. For example, in the embodiment, the circuit 700 is a word line activation circuit. The word line activation circuit 700 activates a word line corresponding to a selected address (referred to as a "selected word line" below). The word line activation circuit 700 supplies a voltage to the selected word line (also referred to as a "word line activation voltage" below) when the selected word line is activated. The word line activation circuit 700 can control a start of supply of the word line activation voltage and a stop of supply of the word line activation voltage.

For example, a circuit 710 concerned with control of bit lines BL is provided in the second voltage domain DOM2. In the embodiment, the circuit 710 is referred to as a "bit line activation circuit". The bit line activation circuit 710 activates a bit line corresponding to a selected address (referred to as a "selected bit line" below). The bit line activation circuit 710 supplies a voltage to the selected bit line (also referred to as a "bit line activating voltage" below) when the selected bit line is activated. The bit line activation circuit 710 can control a start of supply of the bit line activation voltage and a stop of supply of the bit line activation voltage.

For example, a circuit 750 concerned with both word lines WL and bit lines BL is provided in the third voltage domain DOM3. In the embodiment, the circuit 750 is referred to as a "pre-charge circuit". The pre-charge circuit 750 supplies a deactivation voltage to word lines and bit lines. The pre-charge circuit 750 can control a start of supply of the deactivation voltage and a stop of supply of the deactivation voltage to word lines and bit lines.

In this way, the memory device according to the embodiment (e.g., phase change memory) includes the power source domain DOM3 which is used in common for controlling word lines WL and bit lines BL, in addition to the power source domain DOM1 for controlling word lines WL and the power source domain DOM2 for controlling bit lines BL. These three power source domains DOM1, DOM2, and DOM3 have voltage ranges different from each other. The circuits 700, 710, and 750 in the power source domains DOM1, DOM2, and DOM3 respectively operate with voltage ranges which are different from each other. The circuits 700, 710, and 750 respectively supply a different voltage to word lines WL and/or bit lines BL.

The word line activation circuit 700 may be regarded as a component in the row control circuit 110. The bit line activation circuit 710 may be regarded as a component in the column control circuit 120. The pre-charge circuit 750 may be regarded as a component in the row control circuit 110 and/or the column control circuit 120.

(B) EXAMPLES

Examples of the phase change memory according to the embodiment will be described with reference to FIGS. 6 and 7.

Configuration Example

FIG. 6 is a circuit diagram showing an example of a write circuit in the phase change memory of the embodiment.

In the phase change memory of the embodiment, a write circuit 140 includes a signal input circuit 770, a word line activation circuit 700, a bit line activation circuit 710, and a pre-charge circuit 750.

The signal input circuit (interface circuit) 770 includes, an inverter 771, for example.

The input terminal of the inverter 771 is coupled to the control circuit 190. The output terminal of the inverter 771 is coupled to the word line activation circuit 700, the bit line activation circuit 710, and the pre-charge circuit 750, respectively.

For example, the output terminal of the inverter 771 is coupled to the word line activation circuit 700 via a delay circuit 781. The output terminal of the inverter 771 is coupled to the bit line activation circuit 710 via a delay circuit 782 and an inverter 783.

For example, the inverter 771 is provided in a power source domain DOM4 having a range of a ground voltage "VGND" to a positive voltage "VX". The "VX" is +2V (a voltage in the range of +1V to +3V), for example. The "VGND" is 0V.

The input terminal of the delay circuit 781 is coupled to the output terminal of the inverter 771. The output terminal of the delay circuit 781 is coupled to the word line activation circuit 700. The delay circuit 781 has a time constant τ1, for example.

The input terminal of the delay circuit 782 is coupled to the output terminal of the inverter 771. The output terminal of the delay circuit 782 is coupled to the input terminal of the inverter 783. The output terminal of the inverter 783 is coupled to the bit line activation circuit 710. The delay circuit 782 has a time constant τ2, for example.

The inverter 783 is provided between the delay circuit 782 and the bit line activation circuit 710 to adjust the propagation timing of a signal and/or to adjust the polarity of the signal.

For example, the delay circuits 781, 782, and the inverter 783 operate using the voltages (+Vx, VGND) of the power source domain DOM4.

The time constants τ1, τ2, and the presence or absence of the inverter 783 are respectively determined such that an amount of delay from the transition timing of a signal ACT to the "H" level to the time at which a transistor 703 is turned on conforms to an amount of delay from the transition timing of the signal ACT to the "H" level to the time at which a transistor 713 is turned on.

The word line activation circuit (positive voltage circuit) 700 controls the activation of a word line WL during a write operation. The word line activation circuit 700 supplies a voltage having a certain voltage value to a word line WL during a write operation.

The word line activation circuit 700 includes a level shifter 701, inverters 702A, 702B, and a P-type field-effect transistor (voltage supply element) 703.

The input terminal of the level shifter 701 is coupled to the output terminal of the inverter 771 via the delay circuit 781. The output terminal of the level shifter 701 is coupled to the input terminal of the inverter 702A.

The level shifter 701 shifts a voltage used in the power source domain DOM4 to a voltage used in a power source domain DOM1. The level shifter 701 converts a voltage value of the signal level of an input signal (a signal from the power source domain DOM4) to a value corresponding to a voltage value of the signal level of an output signal (a signal used in the power source domain DOM1) of the level shifter 701.

The output terminal of the inverter 702A is coupled to the input terminal of the inverter 702B. The output terminal of the inverter 702B is coupled to the gate of the field-effect transistor (described as "transistor" below) 703.

The inverters 702A and 702B are provided between the level shifter 701 and the transistor 703 to adjust the propagation timing of a signal, adjust the number of logic steps between circuits/elements (on the signal path), and/or to adjust the polarity of the signal. Therefore, the number of inverters 702A and 702B may be one or less, or three or more. The elements/circuits provided on the signal path (between the two components) for adjustment of the timing, adjustment of the number of logic steps, adjustment of the polarity of a signal like the inverters 702A, 702B, are referred to as "adjustment circuits".

One end of a current path of the P-type transistor 703 is coupled to a power source terminal 791. The other end of the current path of the transistor 703 is coupled to a global word line GWL.

A positive power source voltage "VA" is supplied to the power source terminal 791.

The word line activation circuit (positive voltage circuit) 700 is a circuit provided in the first power source domain DOM1. The first power source domain DOM1 uses a voltage ranging from the ground voltage "VGND" to the positive power source voltage "VA". For example, the "VA" is +6V or so (a voltage in the range of +5V to +7V), and the "VGND" is 0V.

The bit line activation circuit (negative voltage circuit) 710 controls the activation of a bit line BL during a write operation. The bit line activation circuit 710 supplies a voltage having a certain voltage value to a bit line BL during a write operation.

The bit line activation circuit 710 includes a level shifter 711, inverters 712A, 712B, and an N-type transistor (voltage supply element) 713.

The input terminal of the level shifter 711 is coupled to the output terminal of the inverter 783. The output terminal of the level shifter 711 is coupled to the input terminal of the inverter 712A.

The level shifter 711 shifts a voltage used in the power source domain DOM4 to a voltage used in a power source domain DOM2. The level shifter 711 converts a voltage value of the signal level of an input signal (a signal input from the power source domain DOM4) to a value corresponding to a voltage value of the signal level of an output signal (a signal used in the power source domain DOM2) of the level shifter 711.

The output terminal of the inverter 712A is coupled to the input terminal of the inverter 712B. The output terminal of the inverter 712B is coupled to a gate of the transistor 713.

The inverters 712A and 712B are provided between the level shifter 711 and the transistor 713 to adjust the propagation timing of a signal and/or to amplify the signal. Therefore, the number of inverters 712A and 712B may be one or less, or three or more. However, it is desired that the number (number of steps) of the inverters 712A and 712B be equal to the number of the inverters 702A and 702B.

One end of a current path of the transistor 713 is coupled to a power source terminal 792. The other end of the current path of the transistor 713 is coupled to the global bit line GBL.

A negative power source voltage "−VA" is supplied to the power source terminal 792.

The bit line activation circuit 710 is a circuit provided in the second voltage domain DOM2.

The second power source domain DOM2 uses a voltage ranging from a negative power source voltage "−VA" to the ground voltage "VGND". For example, "−VA" is −6V or so (a voltage in the range of −5V to −7V). It is desired that the absolute value of the voltage value of "−VA" be equal to the absolute value of the voltage value of "+VA".

Voltage values of a positive voltage (+VA) and a negative voltage (−VA) may be suitably changed in accordance with a voltage used in a write operation and/or the configuration of a phase change memory element.

The pre-charge circuit 750 pre-charges a word line WL and a bit line BL upon completion of a write operation.

The pre-charge circuit 750 includes a level shifter 751, inverters 752, 753, a transfer gate 754, and transistors (voltage supply elements) 755, 756.

The input terminal of the level shifter 751 is coupled to the output terminal of the inverter 771. The output terminal of the level shifter 751 is coupled to the input terminal of the inverter 752.

The level shifter 751 converts a voltage used in the power source domain DOM4 to a voltage used in a power source domain DOM3. The level shifter 751 converts a voltage value of the signal level of an input signal (a signal from the power source domain DOM4) to a value corresponding to a voltage value of the signal level of the output signal (a signal used in the power source domain DOM3) of the level shifter 751.

The output terminal of the inverter 752 is coupled to the input terminal of the inverter 753 and one terminal of the transfer gate 754.

The output terminal of the inverter 753 is coupled to the gate of the N-type transistor 755. One end of a current path of the transistor 755 is coupled to a power source terminal 793. The other end of the current path of the transistor 755 is coupled to the global word line GWL.

The other terminal of the transfer gate 754 is coupled to the gate of the P-type transistor 756. The transfer gate 754 is composed of a P-type transistor and an N-type transistor, in which a source terminal and a drain terminal are coupled to each other. A given constant potential is applied as a gate voltage to the transfer gate 754 such that both the P-type and N-type transistors are normally turned on.

One end of a current path of the transistor 756 is coupled to a power source terminal 794. The other end of the current path of the transistor 756 is coupled to the global bit line GBL.

A voltage "VUX" having a certain voltage value (referred to as a "pre-charge voltage" below) is supplied to the power source terminal 793. The voltage value of VUX is 0V, for example.

A voltage "VUB" having a certain voltage value (referred to as a "pre-charge voltage" below) is supplied to the power source terminal 794. The voltage value of VUB is 0V, for example.

The voltage values of the pre-charge voltages (non-active voltages) VUX and VUB are not limited to 0V and may be suitably changed in accordance with the voltage used for a write operation and/or the circuit configuration of the write circuit. There may be a case where the voltage value of the pre-charge voltage VUB for a bit line BL differs from the pre-charge voltage VUX for a word line WL.

The global word line GWL is coupled between the word line activation circuit 700 and the word line select circuit (e.g., multiplexer) 111.

The global bit line GBL is coupled between the bit line activation circuit 710 and the bit line select circuit (e.g., multiplexer) 121.

A word line driver may be coupled between the word line activation circuit 700 and the word line select circuit 111. A bit line driver may be coupled between the bit line activation circuit 710 and the bit line select circuit 121.

The word line activation circuit 700 and the bit line activation circuit 710 are electrically coupled to a selected cell MC by the multiplexer 111, 121. A word line voltage is supplied to a selected word line WL from the word line activation circuit 700 via the multiplexer 111. A bit line voltage is supplied to a selected bit line from the bit line activation circuit 710 via the multiplexer 121.

With this configuration, a difference in potential between the selected word line WL and the selected bit line BL is applied as a write voltage to the selected cell. The phase of the phase change layer 12 of the phase change memory element in the selected cell MC is changed by the write voltage having a pulse form in accordance with data to be written therein.

As a result, the data is written in the selected cell.

Operation Example

An operation example of the phase change memory of the embodiment will be described with reference to FIG. 7.

Figure 7:
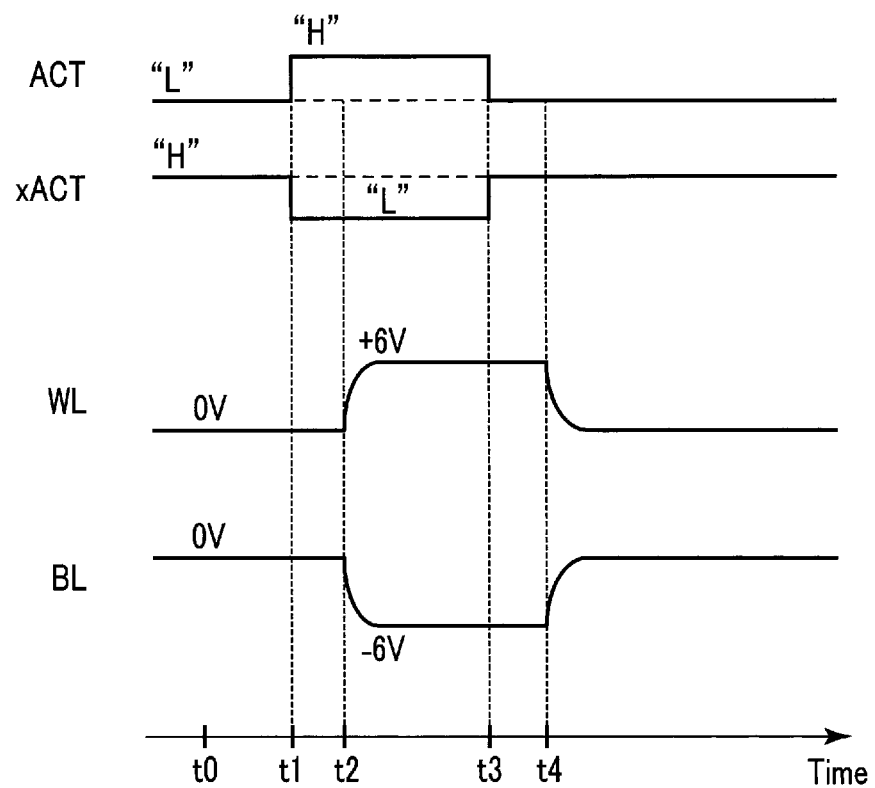
FIG. 7 is a diagram showing an operation example of the memory device according to the first embodiment.

FIG. 7 is a timing chart for explaining the operation example of the phase change memory of the embodiment. In the figure, the operation example of the phase change memory of the embodiment will be described suitably using FIGS. 1 to 6, as well.

<Time t0>

The processor 900 shown in FIG. 1 transfers, to the phase change memory 500 according to the embodiment, a write command CMD, an address ADR indicating a selected cell, data to be written in the memory cell array 100 (referred to as "write data" below), and a control signal CNT.

In the phase change memory 500, the I/O circuit 160 receives the command CMD, address ADR, control signal CNT, and write data DT.

The I/O circuit 160 transfers the command CMD, address ADR and control signal CNT to the control circuit 190. The I/O circuit 160 transfers the write data DT to the write circuit 140.

The control circuit 190 decodes the command CMD and the address ADR, respectively. The control circuit 190 transfers a decoding result of the address ADR to the row control circuit 110 and the column control circuit 120. The control circuit 190 transfers a decoding result of the commend CMD to the write circuit 140. The control circuit 190 controls the operation timing of various circuits in the phase change memory 500, based on the control signal CNT.

In a period in which the signal level of a signal ACT is "L (Low)", the inverter 771 outputs a signal xACT with "H (High)" level.

In the pre-charge circuit 750, the level shifter 751 shifts a voltage value corresponding to the signal level of the signal xACT to a voltage value used in the power source domain DOM3. In the pre-charge circuit 750 of the power source domain DOM3, the voltage value of "H" level signal xACT is converted from +2V to +3V.

The "H" level signal xACT is supplied from the level shifter 751 to the inverter 752. The transfer gate 754 is set to the ON state by a control signal SW.

The inverter 752 supplies a "L" level signal (an inversion signal of the signal xACT) to the inverter 753 and the transfer gate 754. In the power source domain DOM3, the signal with "L" level has a voltage of −3V.

The inverter 753 supplies a "H" level signal to the N-type transistor 755. The transistor 755 is set to the ON-state.

The transfer gate 754, which is normally in the ON state, supplies a "L" level signal to the P-type transistor 756. The transistor 756 is set to the ON-state.

The transistor 755 being in the ON state supplies the voltage 0V to the global word line GWL. With this configuration, the voltage 0V is supplied to a selected word line WL via the global word line GWL and the multiplexer 111.

Concurrently with the supply of the voltage, the transistor 756 in the ON-state supplies a voltage of 0V to the global bit line GBL. The voltage 0V is supplied to the selected bit line BL via the global bit line GBL and the multiplexer 121.

In this way, the selected word line WL and the selected bit line BL are pre-charged with the voltage of 0V.

In a period in which the signal level of the control signal ACT is "L", the word line activation circuit 700 and the bit line activation circuit 710 are set to the OFF state. Therefore, the word line activation circuit 700 and the bit line activation circuit 710 do not supply a voltage to the global word line GWL and the global bit line GBL.

<Time t1>

At time t1, the control circuit 190 changes the signal level of the signal ACT from "L" level to "H" level, based on the decoding result of the command CMD and the control signal. CNT. With this configuration, a "H" level signal ACT is transferred to the write circuit 140.

The write circuit 140 receives the "H" level signal ACT. For example, the write circuit 140 performs a reset operation for a selected cell.

The "H" level signal ACT is input in the signal input circuit 770 of the write circuit 140. In the signal input circuit 770, the inverter 771 receives the "H" level signal ACT. The inverter 771 outputs a "L" level signal xACT.

The "L" level signal xACT is supplied to the pre-charge circuit 750.

In the pre-charge circuit 750, the level shifter 751 shifts the voltage value of the signal xACT to a voltage value used in the power source domain DOM3. In the pre-charge circuit 750 of the power source domain DOM3, the voltage value of the "L" level signal xACT is converted from 0V to −3V.

The inverter 752 supplies a "H" level signal to the inverter 753 and the transfer gate 754.

The inverter 753 supplies a "L" level signal to the gate of the N-type transistor 755. With this configuration, the transistor 755 is set to the OFF-state. The transistor 755 being in the OFF-state electrically separates the global word line GWL from the power source terminal 793.

The transfer gate 754, which is normally in the ON state, supplies the "H" level signal to the P-type transistor 756. With this configuration, the transistor 756 is set to the OFF-state. The transistor 756 being in the OFF-state electrically separates the global bit line GBL from the power source terminal 794.

With this operation, the pre-charge for the selected word line WL and the selected bit line BL is stopped.

<Time t2>

The word line activation circuit 700 and the bit line activation circuit 710 operate in parallel with the operation of the pre-charge circuit 750 caused by the "L" level signal xACT.

The signal xACT is transferred to the word line activation circuit 700 via the delay circuit 781. The signal xACT is transferred to the bit line activation circuit 710 via the delay circuit 782 and the inverter 783.

Therefore, at time t2, the "L" level signal xACT is supplied to the word line activation circuit 700 and the bit line activation circuit 710 at the timing later than the reception timing of the signal in the pre-charge circuit 750, in accordance with the amount of delay of the delay circuits 781, 782.

At the timing in accordance with the time constant τ1, the "L" level signal is transferred from the delay circuit 781 to the word line activation circuit 700. At the timing in accordance with the time constant τ2 and the operation of the inverter 783, the "H" level signal is transferred from the inverter 783 to the bit line activation circuit 710.

In the embodiments, the amount of delay between the delay circuit 781 and the word line activation circuit 700 is set to a value (time constant τ) equal to the amount of delay between the delay circuit 781 and the bit line activation circuit 710. Therefore, the timing at which the word line activation circuit 700 receives the "L" level signal is set to substantially the same timing at which the bit line activation circuit 710 receives the "L" level signal.

In the word line activation circuit 700, the signal level of the "L" level signal is shifted to a value corresponding to a voltage used in the power source domain DOM1 by the level shifter 701.

For example, the level shifter 701 supplies a signal dACT1 of the "L" level corresponding to the voltage value of 0V to the inverter 702A. The inverter 702A supplies a signal of the "H" level corresponding to the voltage value of +6V to the inverter 702B.

The inverter 702B supplies the "L" level signal of 0V to the gate of the P-type transistor 703. The voltage of +6V has been supplied to the source of the transistor 703. Therefore, the transistor 703 is set to the ON-state by the "L" level signal.

With this configuration, the transistor 703 being in the ON state supplies the voltage +6V to the global word line GWL.

In the bit line activation circuit 710, the signal level of a "H" level signal is shifted to a value corresponding to a voltage used in the power source domain DOM2.

For example, the level shifter 711 supplies a "H" level signal corresponding to a voltage value of 0V to the inverter 712A. The inverter 712A supplies a signal of the "L" level corresponding to the voltage value of −6V to the inverter 712B.

The inverter 712B supplies the "H" level signal of 0V to the gate of the N-type transistor 713. The voltage of −6V has been supplied to the source of the transistor 713. Therefore, the transistor 713 is set to the ON-state.

With this configuration, the transistor 713 being in the ON state supplies the voltage −6V to the global bit line GBL.

During the state where the transistor 703 and the transistor 713 are set to the ON-state, the pre-charge circuit 750 is electrically separated from the global word line GWL and the global bit line GBL, for example. The supply of a voltage from the pre-charge circuit 750 is stopped.

Therefore, the output voltage (+6V) of the word line activation circuit 700 is supplied to the selected word line WL via the global word line GWL and the multiplexer 111. The output voltage (−6V) of the bit line activation circuit 710 is supplied to the selected bit line BL via the global bit line GBL and the multiplexer 121.

Therefore, the difference in potential between the selected word line and the selected bit line BL is +12V. In this way, the write voltage is applied to the selected cell.

In the embodiments, in a change in potential of the interconnects GWL and GBL from a pre-charge state to a state where a write voltage is applied, the shift amount of potential (absolute value of a displacement amount of potential) of the global word line (word line) is substantially the same as the shift amount of potential of the global bit line (bit line), owing to the supply of a pre-charge voltage of 0V from the independent power source domain DOM3.

<Time t3>

At time t3, the control circuit 190 changes the signal level of a control signal ACT from the "H" level to the "L" level.

The "H" level signal xACT is supplied to the pre-charge circuit 750. With this operation, the transistors 755 and 756 are set to the ON-state, in the pre-charge circuit 750. A voltage is transferred from the pre-charge circuit 750 to the global word line GWL, and the voltage is transferred from the pre-charge circuit 750 to the global bit line GBL.

Here, since the pre-charge voltage is 0V, the potential of the selected word line WL and the potential of the selected bit line BL hardly change at all, even when transfer of a potential takes place from the pre-charge circuit 750 to the global word line GWL/global bit line GBL.

As described above, the time constant (amount of delay) of the delay circuit is included in the signal path from the inverter 771 to the word line activation circuit 700. Therefore, at the timing the pre-charge circuit 750 is electrically coupled to the global word line GWL by the signal xACT, a "L" level signal is supplied to the word line activation circuit 700.

Therefore, the word line activation circuit 700 continues the supply of the voltage of +6V to the global word line GWL and the word line WL.

Similarly to the above, due to the signal delay, at the timing the pre-charge circuit 750 is electrically coupled to the global bit line GBL by a "H" level signal xACT, the "H" level signal dACT2 is supplied to the bit line activation circuit 710.

Therefore, at the timing immediately after the signal ACT changes from the "H" level to the "L" level, the bit line activation circuit 710 continues to supply the voltage of −6V to the global bit line GBL and the bit line BL.

In such a way, at the timing immediately after the signal level of the control signal ACT is set to the "L" level, a write voltage of 12V (e.g., reset voltage) is continuously supplied to a selected cell.

<Time t4>

At time t4, at the timing in accordance with the time constant (amount of delay) τ of the delay circuit, the signal level of a signal supplied to the circuit 700 changes from the "L" level to the "H" level.

In the word line activation circuit 700, the transistor 703 is set to be in the OFF-state by the "H" level signal. With this, the supply of the voltage from the word line activation circuit 700 to the word line WL is blocked.

In the bit line activation circuit 710, the transistor 713 is set to be in the OFF-state by the "L" level signal. With this, the supply of the voltage from the bit line activation circuit 710 to the bit line BL is blocked.

As a result, the supply of the write voltage to the selected cell is stopped.

As described above, a write operation (e.g., reset operation) of the phase change memory according to the embodiment is completed.

In the phase change memory of the embodiment, substantive operations of the reset operation and the set operation are the same, except that only the voltage value and the pulse width of a write voltage are different.

Therefore, in the embodiment, descriptions on the set operation are omitted. For example, a period in which the control signal ACT is set to the "H" level, the output voltage of the word line activation circuit 700, and the output voltage of the bit line activation circuit 710 differ between the set operation and the reset operation.

With respect to a read operation of the phase change memory of the embodiment, a well-known read operation can be applied. Therefore, explanations on a read operation of the phase change memory of the embodiment are omitted.

(C) SUMMARY

The memory device (e.g., phase change memory) of the embodiment includes a circuit 700 belonging to a first power source domain DOM1, and a circuit 710 belonging to a second power source domain DOM2. The circuit 700 performs control of word lines (e.g., supply of a voltage to a word line). The circuit 710 performs control of bit lines (e.g., supply of a voltage to a bit line).

The memory device of the embodiment includes a circuit 750 belonging to a third power source domain DOM3. The circuit 750 performs deactivation of word lines/bit lines (e.g., pre-charging before application of a reset voltage/set voltage).

In the embodiment, the third power source domain DOM3 is independent of the first and second power source domains DOM1, DOM2.

With this configuration, with respect to signal paths assuming activation/deactivation of word lines or activation/deactivation of bit lines, the memory device of the embodiment can reduce timing lag of the supply of voltages to a word line and a bit line; attributable to a difference in shifting direction of a voltage (polarity of the voltage) in a level shifter inserted into each of the paths, a difference in the shift amount in each of the level shifters, differences in signal paths, etc.

Therefore, the memory device according to the embodiment can comparatively easily synchronize the timing of supplying a voltage to a word line with the timing of supplying a voltage to a bit line.

The memory device according to the embodiment can avoid the occurrence of an unintended forward bias in a PN junction in a circuit (e.g., multiplexer), which is coupled to a word line and a bit line, due to an undershoot/overshoot of potential in the word line and the bit line, even if the deactivation timing of the bit line deviates from the deactivation timing of the word line. The memory device according to the embodiments can reduce forward bias countermeasures through the other methods, against circuits each coupled to a word line and a bit lines. As a result, the memory device according to the embodiment enables comparatively simplification of each circuit coupled to a word line and a bit line and suppressing an increase in area of the circuit.

As described above, the memory device according to the embodiment can increase the reliability of operations.

Therefore, the memory device of the embodiment can enhance the characteristics of the memory device.

(2) Second Embodiment

A memory device according to a second embodiment will be described with reference to FIG. 8.

Figure 8:
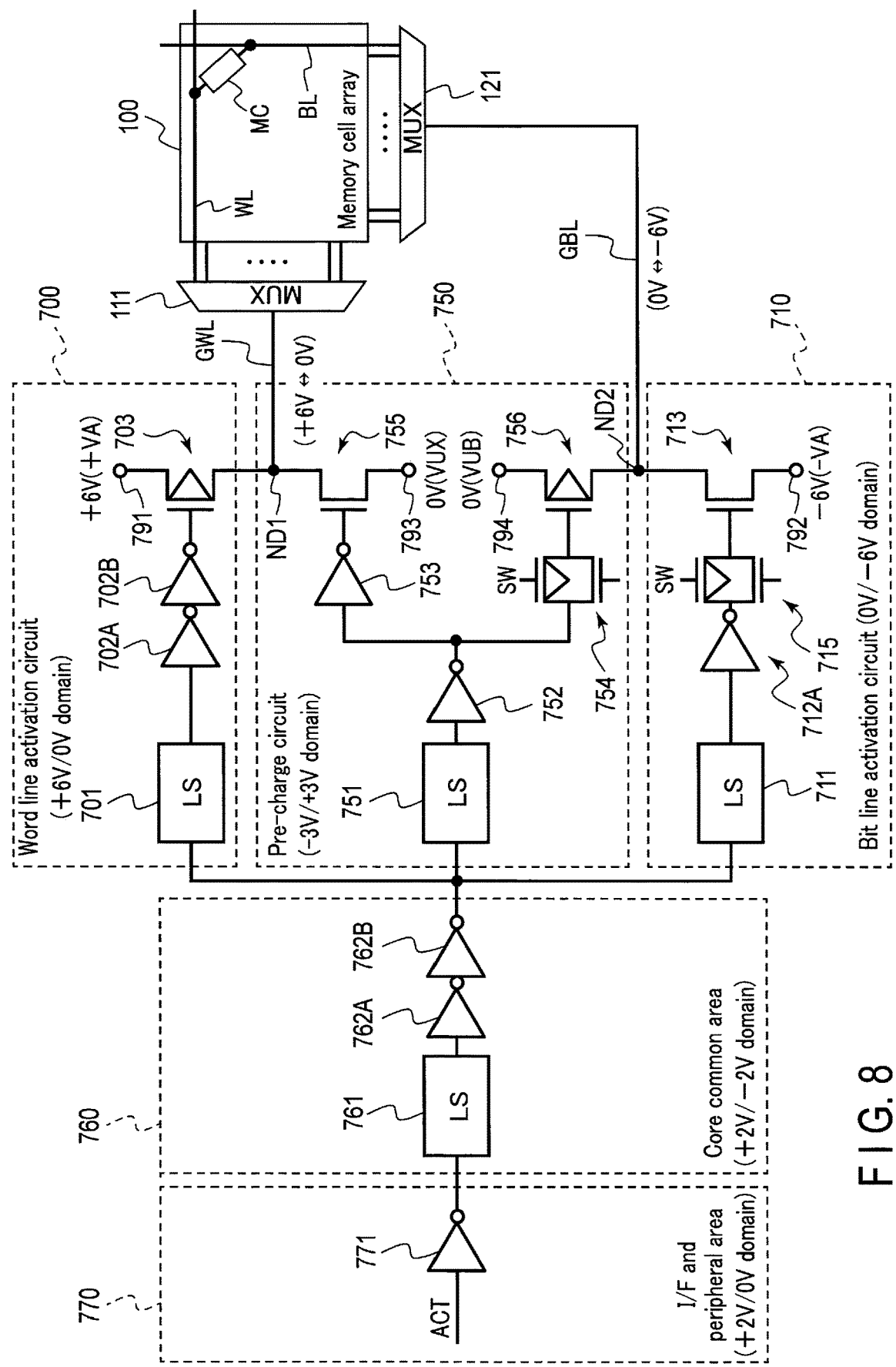
FIG. 8 is a diagram showing a configuration example of a memory device according to a second embodiment.

FIG. 8 is a circuit diagram showing a configuration example of a memory device (e.g., phase change memory) according to the embodiment.

As shown in FIG. 8, a memory device 500 of the embodiment further includes a circuit (referred to as a "core common circuit" below) 760 for buffering the shift amount of a voltage between a signal input circuit 770 and each of the circuits 700, 710, and 750.

The core common circuit 760 is provided in a fifth power source domain DOM5. The power source domain DOM5 is independent of the other power source domains DOM1, DOM2, DOM3 and DOM4.

The core common circuit 760 includes a level shifter 761 and inverters 762A, 762B.

The input terminal of the level shifter 761 is coupled to the output terminal of an inverter 771. The output terminal of the level shifter 761 is coupled to the input terminal of the inverter 762A. The output terminal of the inverter 762A is coupled to the input terminal of the inverter 762B. The output terminal of the inverter 762B is coupled to the word line activation circuit 700, the bit line activation circuit 710, and the pre-charge circuit 750.

The level shifter 761 shifts a voltage value corresponding to a signal to be input to the level of a voltage value used for a signal to be output.

The inverters 762A, 762B are provided for amplification of a signal, adjustment of operation timing, and/or adjustment of the number of steps for elements between circuits, etc.

For example, in a voltage domain DOM5 of the core common circuit 760, a voltage in the range of +2V to −2V is used.

For example, the inverter 771 is provided in an interface/peripheral circuit (signal input circuit) 770.

In a voltage domain DOM4 of the interface/peripheral circuit 770, a voltage in the range of +2V to 0V is used.

The word line activation circuit (core positive voltage circuit) 700 includes a level shifter 701, inverters 702A, 702B, and a transistor 703, etc.

The input terminal of the level shifter 701 is coupled to the output terminal of the inverter 762B in the core common circuit 760. The output terminal of the level shifter 701 is coupled to the input terminal of the inverter 702A. The output terminal of the inverter 702A is coupled to the input terminal of the inverter 702B.

The gate of a P-type transistor 703 is coupled to the output terminal of the inverter 702B.

One end of a current path of the transistor 703 is coupled to a power source terminal 791. The other end of the current path of the transistor 703 is coupled to a node ND1.

A power source voltage "+VA" having a certain voltage value (e.g., +6V) is supplied to the power source terminal 791.

For example, in a voltage domain DOM1 of the word line activation circuit 700, a voltage in the range of +6V to 0V is used.

For example, the level shifter 701 shifts the signal level of +2V from the core common circuit 760 to the signal level of +6V. The level shifter 701 shifts the signal level of −2V from a core common circuit 780 to the signal level of 0V.

The bit line activation circuit (core negative voltage circuit) 710 includes a level shifter 711, an inverter 712A, a transfer gate 715, and an N-type transistor 713.

The input terminal of the level shifter 711 is coupled to the output terminal of the inverter 762B in the core common circuit 760.

The output terminal of the level shifter 711 is coupled to the input terminal of the inverter 712A. The output terminal of the inverter 712A is coupled to one terminal of the transfer gate 715.

The gate of the transistor 713 is coupled to the other terminal of the transfer gate 715.

One end of a current path of the transistor 713 is coupled to a power source terminal 792. The other end of the current path of the transistor 713 is coupled to the node ND2.

A negative power source voltage "−VA" is supplied to the power source terminal 792. The voltage value of the negative power source voltage "−VA" is −6V or so, for example.

For example, in a voltage domain DOM2 of the bit line activation circuit 710, a voltage in the range of 0V to −6V is used.

The level shifter 711 shifts the signal level of +2V from the core common circuit 760 to the signal level of 0V, for example. The level shifter 701 shifts the signal level of −2V from the core common circuit 760 to the signal level of −6V.

The pre-charge circuit 750 includes a level shifter 751, inverters 752, 753, a transfer gate 754, and transistors 755, 756.

The input terminal of the level shifter 751 is coupled to the output terminal of the inverter 762B in the core common circuit 760. The output terminal of the level shifter 751 is coupled to the input terminal of the inverter 752.

The output terminal of the inverter 752 is coupled to the input terminal of the inverter 753. The gate of the N-type transistor 755 is coupled to the output terminal of the inverter 753.

One end of a current path of the transistor 755 is coupled to a power source terminal 793. The other end of the current path of the transistor 755 is coupled to the node ND1.

The output terminal of the inverter 752 is coupled to one terminal of the transfer gate 754.

The gate of the P-type transistor 756 is coupled to the other terminal of the transfer gate 754. One end of a current path of the transistor 756 is coupled to a power source terminal 794. The other end of the current path of the transistor 756 is coupled to the node ND2.

A voltage VUX having a certain voltage value (e.g., 0V) is supplied to the power source terminal 793. A voltage VUB of a certain voltage value (e.g., 0V) is supplied to the power source terminal 794.

For example, the level shifter 751 shifts the signal level of +2V from the core common circuit 760 to the signal level of +3V. The level shifter 751 shifts the signal level of −2V from the core common circuit 760 to the signal level of −3V.

The node ND1 is coupled to the global word line GWL. The node ND2 is coupled to the global bit line GBL.

The word line activation circuit 700 supplies a positive voltage "+VA" to the global word line GWL. The positive voltage "+VA" is supplied to a selected word line WL via a multiplexer 111.

The bit line activation circuit 710 supplies a negative voltage "−VA" to the global bit line GBL. The negative voltage "−VA" is supplied to a selected bit line BL via a multiplexer 121.

The pre-charge circuit 750 supplies the voltage "VUX" to the global word line GWL. The voltage "VUX" is supplied to the selected word line WL via the multiplexer 111. The voltage value of "VUX" is 0V (ground voltage), for example.

The pre-charge circuit 750 supplies the voltage "VUB" to the global bit line. GBL. The voltage "VUB" is supplied to the selected bit line BL via the multiplexer 121. The voltage value of "VUB" is 0V (ground voltage), for example.

With the configuration described above, in the embodiment, the potential of the global word line GWL varies in the range of from 0V to +6V, and the potential of the global bit line GBL varies in the range of from −6V to 0V.

In the embodiment, when the control signal ACT has the "L" level, the pre-charge circuit 750 supplies pre-charge voltages VUX, VUB of 0V to the global word line GWL and the global bit line GBL, respectively. On the other hand, the word line activation circuit 700 is electrically separated from the global word line GWL, and the bit line activation circuit 710 is electrically separated from the global bit line GBL.

When the control signal ACT has the "H" level, the pre-charge circuit 750 is electrically separated from the global word line GWL and the global bit line GBL. On the other hand, the word line activation circuit 700 supplies a voltage of +6V to the global word line GWL, and the bit line activation circuit 710 supplies a voltage of −6V to the global bit line GBL.

In the embodiment, the operations of the phase change memory are substantially the same as those of the above example explained with reference to FIG. 7. Therefore, explanations on the operation example of the phase change memory are omitted in this embodiment.

In the phase change memory of the embodiment, after the pre-charge circuit pre-charges a word line WL and a bit line BL using a voltage. 0V, the word line activation circuit supplies a positive voltage to the word line, and the bit line activation circuit supplies a negative voltage to the bit line, similarly to the first embodiment.

In the phase change memory of the embodiment, the core common circuit 760 operates in a voltage domain using a voltage between the voltage range of a power source domain of a circuit in a previous step (here, interface/peripheral circuit) and the voltage range of power source domains of circuits in the subsequent steps (here, the word line activation circuit, the bit line activation circuit, and the pre-charge circuit).

With this configuration, regarding the shift from a voltage used in the power source domain of the circuit in the previous step on the signal input side to a voltage used in the power source domain of the plurality of circuits in the subsequent steps, the phase change memory of the embodiment allows for reduction in difference in shifting speed of the voltage in the plurality of circuits in the subsequent steps.

The phase change memory according to the embodiment can further reduce the timing lag between the operation timing of a circuit related to the control of word lines (e.g., activation and/or supply of a voltage) and the operation timing of a circuit related to the control of bit lines (e.g., activation and/or supply of a voltage).

Therefore, the memory device of the embodiment can enhance the characteristics of the memory device.

(3) Third Embodiment

A memory device according to a third embodiment will be described with reference to FIG. 9.

FIG. 9 is a schematic diagram for illustrating a memory device (e.g., phase change memory) according to the third embodiment.

In this embodiment, the power source domain DOM3 in the first and second embodiment may be divided into a power source domain DOM3A and a power source domain DOM3B, and circuits supplying a voltage to a memory cell MC during a deactivation (pre-charge) may be provided to power source domains different from each other, as shown in FIG. 9.

A word line activation circuit 700 is provided in a first power source domain DOM1.

The word line activation circuit 700 includes an element for supplying a voltage (referred to as a "voltage supply element" below) 703 and a control circuit 709. The voltage supply element 703 supplies a voltage for activating a word line (memory cell) to a selected word line WL.

The voltage supply element 703 is a P-type transistor, for example. One end of a current path of the transistor 703 is coupled to the global word line (interconnect) GWL. The other end of the current path of the transistor 703 is coupled to a first power source terminal 791. The gate of the transistor 703 is coupled to the control circuit 709. The threshold voltage of the transistor 703 is "VthA" or so.

For example, a voltage VA is applied to the first power source terminal 791. The voltage VA is, for example, a positive voltage.

The control circuit 709 controls the ON/OFF, the operation timing, and a period of the ON-state/OFF-state of the voltage supply element (transistor) 703. For example, the control circuit 709 converts the voltage level of a circuit in the previous step of the word line activation circuit 700 to the level of a voltage used in the word line activation circuit 700.

For example, the control circuit 709 includes, a level shifter, an inverter, a delay circuit, and a transfer gate, etc.

In the voltage domain DOM1, a voltage in the range of a voltage VX1 to a voltage VZ1 is supplied. The voltage VX1 has a voltage value equal to or higher than "VA". The voltage VZ1 has a voltage value lower than "VA−VY1". The voltage VY1 (absolute value) has a voltage value equal to or higher than the threshold voltage (absolute value) of the voltage supply element 703.

A bit line activation circuit 710 is provided in a second power source domain DOM2.

The bit line activation circuit 710 includes a voltage supply element 713 and a control circuit 719.

The voltage supply element 713 supplies a voltage for activating a bit line to a selected bit line BL.

The voltage supply element 713 is, for example, an N-type transistor. One end of a current path of the transistor 713 is coupled to the global bit line GBL. The other end of the current path of the transistor 713 is coupled to a second power source terminal 792. The gate of the transistor 713 is coupled to the control circuit 719. The threshold voltage of the transistor 713 is "VthB" or so.

For example, a voltage VD is applied to the second power source terminal 792. The voltage VD is, for example, a negative voltage.

The control circuit 719 controls the ON/OFF, the operation timing, and a period of the ON-state/OFF-state of the transistor 713.

For example, the control circuit 719 converts the voltage level of a circuit in the previous step of the bit line activation circuit 710 to the level of a voltage used in the bit line activation circuit 710.

For example, the control circuit 719 includes, a level shifter, an inverter, a delay circuit, and a transfer gate, etc.

In the voltage domain DOM2, a voltage in the range of a voltage VX2 to a voltage VZ2 is supplied. The voltage VX2 has a voltage value equal to or lower than "VD". The voltage VZ2 has a voltage value higher than "VD+VY2". The voltage VY2 (absolute value) has a voltage value equal to or higher than the threshold voltage (absolute value) of the voltage supply element 713.

A word line deactivation circuit (word line pre-charge circuit) 750A is provided in a third power source domain DOM3A.

The word line deactivation circuit 750A includes a voltage supply element 755 and a control circuit 759A.

The voltage supply element 755 supplies a voltage for deactivating a word line (memory cell) to a word line WL.

The voltage supply element 755 is, for example, an N-type transistor. One end of a current path of the transistor 755 is coupled to the global word line GWL. The other end of the current path of the transistor 755 is coupled to a third power source terminal 794A. The gate of the transistor 755 is coupled to the control circuit 759A. The threshold voltage of the transistor 755 is "VthC".

For example, a voltage VB is applied to the third power source terminal 794A. The voltage VB is, for example, a negative voltage.

The control circuit 759A controls the ON/OFF, the operation timing, and a period of the ON-state/OFF-state of the voltage supply element (transistor) 755. For example, the control circuit 759A converts the voltage level of a circuit in the previous step of the word line deactivation circuit 750A to the level of a voltage used in the word line deactivation circuit 750A.

For example, the control circuit 759A includes, a level shifter, an inverter, a delay circuit, and a transfer gate, etc.

In the voltage domain DOM3A, a voltage in the range of a voltage VX3 to a voltage VZ3 is supplied. The voltage VX3 has a voltage value equal to or higher than "VB". The voltage VZ3 has a voltage value higher than "VB+VY3". The voltage VY3 (absolute value) has a voltage value equal to or higher than the threshold voltage (absolute value) of the voltage supply element 755.

A bit line deactivation circuit (bit line pre-charge circuit) 750B is provided in a fourth power source domain DOM3B.

The bit line deactivation circuit 750B includes a voltage supply element 756 and a control circuit 759B.

The voltage supply element 756 supplies a voltage for deactivating a bit line BL to the bit line WL.

The voltage supply element 756 is, for example, a P-type transistor. One end of a current path of the transistor 756 is coupled to the global bit line GBL. The other end of the current path of the transistor 756 is coupled to a fourth power source terminal 794B. The gate of the transistor 756 is coupled to the control circuit 759B. The threshold voltage of the transistor 756 is "VthD".

For example, a voltage VC is applied to the fourth power source terminal 794B. The voltage VC is, for example, a positive voltage.

The control circuit 759B controls the ON/OFF, the operation timing, and a period of the ON-state/OFF-state of the voltage supply element (transistor) 756.

For example, the control circuit 759B converts the voltage level of a circuit in the previous step of the bit line deactivation circuit 750B to the level of a voltage used in the bit line deactivation circuit 750B.

For example, the control circuit 759B includes, a level shifter, an inverter, a delay circuit, and a transfer gate, etc.

In the voltage domain DOM3B, a voltage in the range of a voltage VX4 to a voltage VZ4 is supplied. The voltage VX4 has a voltage value equal to or higher than "VC". The voltage VZ3 has a voltage value lower than "VC−VY4". The voltage VY4 (absolute value) has a voltage value equal to or higher than the threshold voltage (absolute value) of the voltage supply element 756.

Even when circuits for deactivation of a word line and a bit line are provided in different power source domains as in the memory device (e.g., phase change memory) of the embodiment, it is possible to obtain substantially the same advantageous effects as those of the embodiments described above.

(4) Other

In the memory device according to the embodiments, the configurations of a memory cell and a memory cell array are not limited to the examples shown in FIGS. 2 to 4.

For example, a memory cell having a field-effect transistor may be used in the memory device of the embodiments. The field-effect transistor (referred to as a "cell transistor" below) functions as a switching element of the memory cell. The memory cell is coupled to two bit lines forming a bit line pair and a word line. One end of a current path of a cell transistor is coupled to a first bit line, and the other end of the current path of the cell transistor is coupled to one end of a phase change memory element (variable resistance element). The other end of the phase change memory element is coupled to a second bit line (source line). The gate of the cell transistor is coupled to the word line.

The memory device of the embodiments may be a magnetic memory (MRAM) or a resistance change memory (ReRAM).

In the embodiments, the description "coupled" may suitably encompass not only the case where two components are directly coupled to each other without mediation of another element, but also the case where the two components are indirectly coupled to each other via the "another element", in accordance with the relationship between the components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first interconnect;
   a second interconnect;
   a memory cell electrically coupled between the first interconnect and the second interconnect and including a memory element;
   a first circuit provided in a first power source domain having a range of a first voltage to a second voltage, the second voltage higher than the first voltage, the first circuit controlling a start and a stop of supply of the second voltage to the first interconnect;
   a second circuit provided in a second power source domain having a range of a third voltage to the first voltage, the third voltage lower than the first voltage, the second circuit controlling a start and a stop of supply of the third voltage to the second interconnect; and
   a third circuit provided in a third power source domain having a range of a fourth voltage to a fifth voltage, the fourth voltage lower than the first voltage and higher than the third voltage, the fifth voltage lower than the second voltage and higher than the first voltage, the third circuit controlling a start and a stop of supply of a sixth voltage to the first and second interconnects, the six voltage between the fourth voltage and the fifth voltage.

2. The memory device according to claim 1, wherein after the third circuit supplies the sixth voltage to the first and second interconnects, respectively, the first circuit stops the supply of the second voltage to the first interconnect, and the second circuit stops the supply of the third voltage to the second interconnect.

3. The memory device according to claim 1, wherein
   the second voltage is a positive voltage, and the third voltage is a negative voltage, and
   a difference in voltage between the second voltage and the third voltage corresponds to a write voltage applied to the memory cell.

4. The memory device according to claim 1, further comprising:
   a fourth circuit provided in the fourth power source domain,
   wherein
   the first circuit comprises:
      a first level shifter electrically coupled to the fourth circuit,
      a first adjustment circuit electrically coupled to the first level shifter, and
      a first transistor including a first gate electrically coupled to the first adjustment circuit, a first terminal electrically coupled to the first interconnect, and a second terminal to which the second voltage is supplied;
   the second circuit comprises:
      a second level shifter electrically coupled to the fourth circuit,
      a second adjustment circuit electrically coupled to the second level shifter, and
      a second transistor including a second gate electrically coupled to the second adjustment circuit, a third terminal electrically coupled to the second interconnect, and a fourth terminal to which the third voltage is supplied.

5. The memory device according to claim 4, wherein
   the third circuit comprises:
      a third level shifter electrically coupled to the fourth circuit,
      a third adjustment circuit electrically coupled to the third level shifter, and a third transistor including a third gate electrically coupled to the third adjustment circuit, a fifth terminal electrically coupled to the first interconnect, and a sixth terminal to which the sixth voltage is supplied, a fourth adjustment circuit electrically coupled to the third level shifter, and a fourth transistor including a fourth gate electrically coupled to the fourth adjustment circuit, a seventh terminal electrically coupled to the second interconnect, and an eighth terminal to which the sixth voltage is supplied.

6. The memory device according to claim 4, wherein the first and second adjustment circuits adjust a polarity and the timing of a signal transferred by each of the first and second adjustment circuits.

7. The memory device according to claim 5, wherein the first, second, third and fourth adjustment circuits adjust a polarity and the timing of a signal transferred by each of the first, second, third and fourth adjustment circuits.

8. The memory device according to claim 1, wherein an absolute value of a voltage value of the third voltage is equal to an absolute value of a voltage value of the second voltage; and a potential difference between the first and second voltages, a potential difference between the first and third voltages, and a potential difference between the fourth and fifth voltages are equal to one another.

9. The memory device according to claim 1, wherein the memory device is a phase change element.

10. A memory device comprising:
a first interconnect,
a second interconnect,
a memory cell electrically coupled between the first interconnect and the second interconnect and including a memory cell,
a first circuit provided in a first power source domain having a range of a first voltage to a second voltage, the second voltage higher than the first voltage, the first circuit controlling a start and a stop of supply of the second voltage to the first interconnect;
a second circuit provided in a second power source domain having a range of a third voltage to the first voltage, the third voltage lower than the first voltage, the second circuit controlling a start and a stop of supply of the third voltage to the second interconnect;
a third circuit provided in a third power source domain having a range of a fourth voltage to a fifth voltage, the fourth voltage lower than the first voltage and higher than the third voltage, the fifth voltage lower than the second voltage and higher than the first voltage, the third circuit controlling a start and a stop of supply of a sixth voltage to the first interconnect, the sixth voltage between the fourth voltage and the fifth voltage; and
a fourth circuit provided in a fourth power source domain having a range of a seventh voltage to an eighth voltage, the seventh voltage lower than the first voltage and higher than the third voltage, the eighth voltage lower than the second voltage and higher than the first voltage, the fourth circuit controlling a start and a stop of supply of a ninth voltage to the second interconnect, the ninth voltage between the seventh voltage and the eighth voltage.

11. The memory device according to claim 10, wherein after the third circuit supplies the sixth voltage to the first interconnects and the fourth circuit supplies the ninth voltage to the second interconnects, the first circuit stops the supply of the second voltage to the first interconnect, and the second circuit stops the supply of the third voltage to the second interconnect.

12. The memory device according to claim 10, wherein the second voltage is a positive voltage, and the third voltage is a negative voltage, and
a difference in voltage between the second voltage and the third voltage corresponds to a write voltage applied to the memory cell.

13. The memory device according to claim 10, wherein a voltage value of the sixth voltage is equal to a voltage value of the ninth voltage.

14. The memory device according to claim 10, wherein the first circuit comprises:
a first control circuit, and
a first transistor including a first gate electrically coupled to the first control circuit, a first terminal electrically coupled to the first interconnect, and a second terminal to which the second voltage is supplied;
the second circuit comprises:
a second control circuit, and
a second transistor including a second gate electrically coupled to the second control circuit, a third terminal electrically coupled to the second interconnect, and a fourth terminal to which the third voltage is supplied.

15. The memory device according to claim 14, wherein the first and second control circuits control a polarity and the timing of a signal transferred by each of the first and second control circuits.

16. The memory device according to claim 14, wherein the third circuit comprises:
a third control circuit, and
a third transistor including a third gate electrically coupled to the third control circuit, a fifth terminal electrically coupled to the first interconnect, and a sixth terminal to which the sixth voltage is supplied;
the fourth circuit comprises:
a fourth control circuit, and
a fourth transistor including a fourth gate electrically coupled to the fourth control circuit, a seventh terminal electrically coupled to the second interconnect, and an eighth terminal to which the ninth voltage is supplied.

17. The memory device according to claim 16, wherein the first, second, third, and fourth control circuits control a polarity and the timing of a signal transferred by each of the first, second, third, and fourth control circuits.

18. The memory device according to claim 16, wherein each of the first, second, third and fourth control circuits includes a level shifter.

19. The memory device according to claim 10, wherein an absolute value of a voltage value of the third voltage is equal to an absolute value of a voltage value of the second voltage; and a potential difference between the first and second voltages, a potential difference between the first and third voltages, a potential difference between the fourth and fifth voltages and a potential difference between the seventh and eighth voltages are equal to one another.

* * * * *